(12) United States Patent
Chang et al.

(10) Patent No.: US 12,424,515 B2
(45) Date of Patent: Sep. 23, 2025

(54) SOIC CHIP ARCHITECTURE

(71) Applicant: Taiwan Semiconductor Manufacturing Co., Ltd., Hsinchu (TW)

(72) Inventors: Fong-Yuan Chang, Hsinchu County (TW); Chin-Chou Liu, Hsinchu County (TW); Chin-Her Chien, Taoyuan County (TW); Cheng-hung Yeh, Mialoi County (TW); Hui Yu Lee, Hsin-Chu (TW); Po-Hsiang Huang, Tainan (TW); Yi-Kan Cheng, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 87 days.

(21) Appl. No.: 16/562,540

(22) Filed: Sep. 6, 2019

(65) Prior Publication Data
US 2020/0168527 A1  May 28, 2020

Related U.S. Application Data

(60) Provisional application No. 62/772,380, filed on Nov. 28, 2018.

(51) Int. Cl.
*H01L 23/48* (2006.01)
*H01L 23/00* (2006.01)
(Continued)

(52) U.S. Cl.
CPC ........ *H01L 23/481* (2013.01); *H01L 23/5383* (2013.01); *H01L 24/09* (2013.01);
(Continued)

(58) Field of Classification Search
CPC . H01L 23/147; H01L 23/481; H01L 23/5383; H01L 24/09; H01L 24/13;
(Continued)

(56) References Cited

U.S. PATENT DOCUMENTS 10,153,222 B2    12/2018  Yu et al.
10,756,019 B1 *   8/2020  Wu ........................ H01L 25/042
(Continued)

FOREIGN PATENT DOCUMENTS

CN   108074828 A   5/2018
CN   108074872 A   5/2018
(Continued)

OTHER PUBLICATIONS

"Three-dimensional integrated circuits", A.W. Topol et al., IBMJ. Res. & Dev., vol. 50, No. 4/5, Jul./Sep. 2006 (Year: 2006).*

*Primary Examiner* — Brigitte A Paterson
(74) *Attorney, Agent, or Firm* — Sterne, Kessler, Goldstein &Fox P.L.L.C.

(57) ABSTRACT

A device, such as a computer system, includes an interconnection device die and at least two additional device dice. The additional device dies can be system on integrated chip (SOIC) dies laying face to face (F2F) on the interconnection device die. The interconnection device die includes electrical connectors on one surface, enabling connection to and/or among the additional device dice. The interconnection device die includes at least one redistribution circuit structure, which may be an integrated fan out (InFO) structure, and at least one through-silicon via (TSV). The TSV enables connection between a signal line, power line or ground line, from an opposite surface of the interconnection device die to the redistribution circuit structure and/or electrical connec-
(Continued)

tors. At least one of the additional dice can be a three-dimensional integrated circuit (3DIC) die with face to back (F2B) stacking.

21 Claims, 9 Drawing Sheets

(51) Int. Cl.
| | | |
|---|---|---|
| *H01L 23/14* | (2006.01) | |
| *H01L 23/538* | (2006.01) | |
| *H01L 25/065* | (2023.01) | |
| *H01L 25/18* | (2023.01) | |
| *H10D 88/00* | (2025.01) | |

(52) U.S. Cl.
CPC .......... *H01L 24/17* (2013.01); *H01L 25/0652* (2013.01); *H10D 88/00* (2025.01); *H01L 23/147* (2013.01); *H01L 24/13* (2013.01); *H01L 24/16* (2013.01); *H01L 25/18* (2013.01); *H01L 2224/02379* (2013.01); *H01L 2224/13005* (2013.01); *H01L 2224/13082* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16227* (2013.01); *H01L 2225/06513* (2013.01); *H01L 2225/06517* (2013.01); *H01L 2225/06527* (2013.01); *H01L 2225/06541* (2013.01); *H01L 2924/381* (2013.01)

(58) Field of Classification Search
CPC ......... H01L 24/16; H01L 24/17; H01L 24/18; H01L 25/0652; H01L 25/0688; H01L 25/18; H01L 2224/02379; H01L 2224/13005; H01L 2224/13082; H01L 2224/13111; H01L 2224/13139; H01L 2224/13144; H01L 2224/13147; H01L 2224/13155; H01L 2224/16145; H01L 2224/16227; H01L 2225/06513; H01L 2225/06517; H01L 2225/06527; H01L 2225/06541; H01L 27/0688

See application file for complete search history.

(56) References Cited

U.S. PATENT DOCUMENTS

| | | |
|---|---|---|
| 10,770,365 B2 | 9/2020 | Yu et al. |
| 10,867,965 B2 | 12/2020 | Shih et al. |
| 2012/0106117 A1 | 5/2012 | Sundaram et al. |
| 2013/0049216 A1* | 2/2013 | Lin ..................... H01L 23/5384 257/774 |
| 2013/0137216 A1 | 5/2013 | Ito et al. |
| 2014/0321804 A1* | 10/2014 | Thacker .............. H01L 25/0655 385/14 |
| 2016/0148891 A1* | 5/2016 | Tsao ........................ H01L 24/16 257/737 |
| 2017/0005073 A1 | 1/2017 | Lin et al. |
| 2017/0062383 A1* | 3/2017 | Yee ....................... H01L 21/486 |
| 2017/0162507 A1* | 6/2017 | Das ....................... H01L 23/481 |
| 2018/0025973 A1* | 1/2018 | Fu ....................... H01L 23/5389 257/499 |
| 2018/0190635 A1* | 7/2018 | Choi .................... H01L 23/5386 |
| 2018/0284186 A1* | 10/2018 | Chadha ................... H01L 24/13 |
| 2018/0285493 A1* | 10/2018 | Huang ................... G06F 30/20 |
| 2018/0366436 A1* | 12/2018 | Wang ....................... H01L 24/24 |
| 2020/0043530 A1* | 2/2020 | Shibata ............... H01L 25/0657 |
| 2020/0144189 A1* | 5/2020 | Yoo ................... H01L 27/10805 |

FOREIGN PATENT DOCUMENTS

| | | |
|---|---|---|
| TW | 201336039 A | 9/2013 |
| TW | 2018/34086 A | 9/2018 |
| WO | WO-2014/078130 A1 | 5/2014 |

* cited by examiner

SOIC CHIP ARCHITECTURE

CROSS-REFERENCE TO RELATED APPLICATION

The present application claims the benefit of U.S. Provisional Patent Appl. No. 62/772,380, filed Nov. 28, 2018, titled "SOIC AI Chip Architecture," which is incorporated herein by reference in its entirety.

BACKGROUND

Advances in the big data and artificial intelligence (AI) industries have enabled natural language and cognitive technology capabilities and empowered information technology to perform tasks traditionally performed by humans. Such technologies permit consumers to off load tasks to such devices and help companies improve the quality of services, reduce response time for customers, and reduce costs. However, the increasing complexity and breadth of AI and big data operations strain existing computer systems with respect to memory access, real-time service, and power consumption.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

Figure 1A:
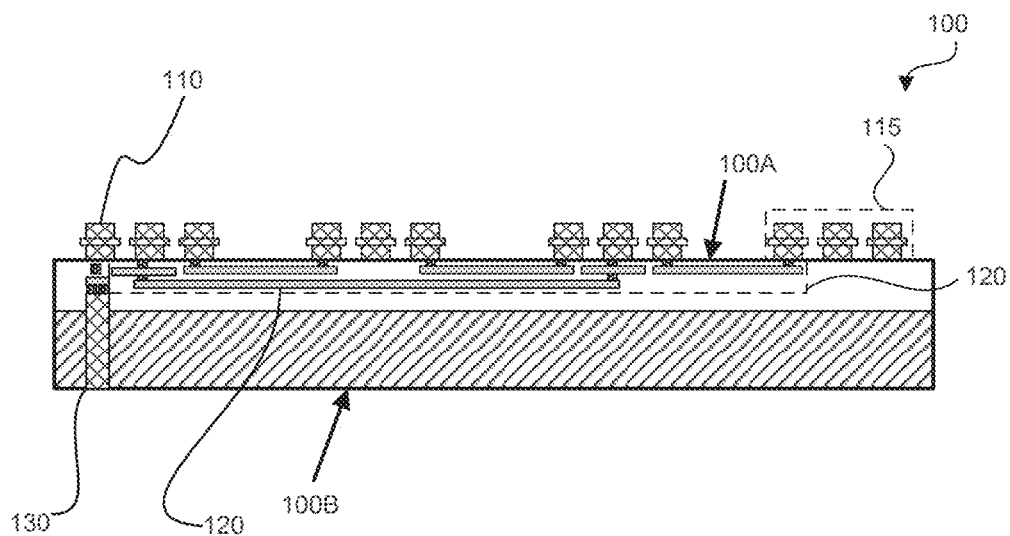
FIGS. 1A to 1C are illustrations of an exemplary device die in cross sectional views that incorporate electrical connectors, according to some embodiments.

The accompanying drawings, which are incorporated herein and form part of the specification, illustrate the present disclosure and, together with the description, further serve to explain the principles of the disclosure and to enable a person skilled in the relevant art to make and use the disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5% of the value (e.g., ±1%, ±2%, ±3%, ±4%, or ±5% of the value).

Overview

Embodiments of the present disclosure relate to a design for a base/interconnection device die and to designs for additional dice connected therewith, such as a system on integrated chip (SOIC) packaging design.

In the fields of artificial intelligence (AI) and big data, digital data increasingly encompasses every corner of business, science, engineering and many other disciplines. The term "big data" refers to data sets, including large, diverse, complex, longitudinal, or distributed data sets generated from instruments, sensors, Internet transactions, email, video, click streams, and all other digital sources available today and in the future. The term "big data" can also refer to data that is too large, too dispersed, and too unstructured to be handled using certain types of hardware and software facilities.

The massive scale of modern data, such as analytics data or AI programming, easily overwhelms memory and computation resources on computational servers. For example, deriving meaningful insights from big data requires rich analytics. The big data and AI sectors demand ever increasing throughput to extraordinary large volumes of data. This is true both with respect to the exponential rise in the volume of data itself and to the increasingly number and complexity of formats of data that such platforms must manage. AI and big data chipsets today are required to manage not just relational data, but also text, video, image, emails, social network feeds, real time data streams, sensor data, etc.

Big data is defined by the three V's: volume, velocity, and variety. Volume refers to the quantity of data being processed relative to processing capability. A query operation today to retrieve or process 20 terabytes of data may grow to a 100 terabyte volume and beyond. Storage and the processing of vast amounts of data in a scalable fashion requires system architectures that are capable of handling operations at high bandwidth. Velocity describes the frequency at which data is generated and delivered. The velocity of large data streams face the rising challenges of operations and processes to be performed in real-time, as well as the increasing demand for such operations to identify patterns and intents from such inputs. Variety refers to the complexity of different data types in addition to transactional data. The addition of unstructured data, such as speech and language, increasingly complicate the categorization of data. Delivering and processing such diverse data requires novel processing and memory capabilities to efficiently serve AI and big data clients.

Embodiments of present disclosure are directed to SOIC devices and architecture that enables computer systems to meet the rigorous demands that big data places on networks, storage and servers. The embodiments provided herein provide devices, computer systems and methods to solve the above problems. As noted above, modern AI and big data systems encounter ever increasing requirement with respect to memory access and bandwidth, real time processing and data delivery, and reduced power consumption.

Embodiments of the present disclosure include an interconnection device die and SOIC architecture that addresses such problems. Embodiments disclosed herein are provided to reduce the distance among processors and memories, increase the number of device-to-device (D2D) connections in the packaging, and provide high bandwidth (HB) memory capable of meeting these requirements.

A device die is provided as an interconnection device die (also referred to herein as a "base die" or "interconnection die"). The interconnection device die provides a structure on which other device dice, e.g., integrated circuit dice, such as SOICs, 3DICs, processors, or the like can be supported and interconnected.

An integrated fan out ("InFO") structure includes a circuit providing connectivity in a compact design. The InFO structure can include at least one redistribution circuit structure embedded in at least one insulating encapsulation of a device die, where the redistribution circuit structure includes one or more conductors electrically connected to conductive terminals arranged on a surface of the device die.

A system on integrated chip ("SOIC") structure includes active dice stacked one on top of another and interconnected vertically using through-silicon vias (TSVs). An SOIC can be a three-dimensional integrated circuit ("3DIC"). For example, a 3DIC includes a stack of similar active dices, such as a stack of memory dice with a controller logic on a separate die (e.g., a bottom die). In some embodiments, the 3DIC can include a stack of different dice. The dice can be stacked face to back (F2B). If stacked F2B, at least two dice are stacked, one on top of the other, with their active areas facing downwards. In some embodiments, the lower die includes metallization on a back surface of a substrate, and electrical connectors such as micro bumps, connect the top die to this metallization. TSVs pass through the lower die's substrate and connect the micro bumps on the top die, via the back-side metallization, to the active area of the second die. In some embodiments, the dice can be stacked face to face (F2F) in which the active areas of the lower die and the upper die face each other with electrical connectors providing connectivity between the dice. In a F2F structure, a TSV can pass through one die, such as the lower die, and metallization or redistribution circuit can be formed on the back thereof to provide connection to components of the package.

The SOIC architecture can be electrically coupled to other device dies, such as one or more memories and/or processors. The memory stores one or more instructions. The processor executes the one or more instructions; the one or more instructions, when executed by the processor, configure the processor to perform data analysis and search queries.

This disclosure relates to a device, such as a computer system, that includes: an interconnection device die, which can be an interconnection device die; at least two additional dice, which can be SOIC dice, which lay F2F on the interconnection device die; and at least one through-silicon via (TSV) that enables connection to a signal line, power line or ground line, to an opposite surface of the interconnection device die and to at least one electrical connector or at least one redistribution circuit structure, which may be an integrated fan out (InFO) structure. At least one of the additional dice can be a three-dimensional (3D) integrated circuit die with F2B stacking.

Interconnection Device Die

Figure 1B:
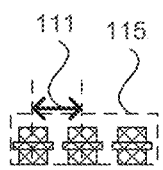
Figure 1C:
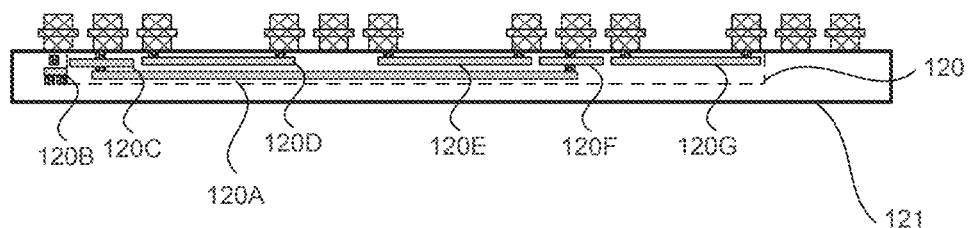

FIGS. 1A to 1C illustrate a device die 100. Device die 100 can be a base/interconnection device die. As shown in FIG. 1A and described in greater detail below in FIGS. 1B and 1C, device die 100 includes electrical connectors 110 and a redistribution circuit structure 120 arranged to confer a number of benefits applicable to big data and AI applications. Specifically, as shown in FIG. 1A, a first surface 100A of device die 100, for example a top or face surface, includes electrical connectors 110. A second surface 100B of device die 100, for example a bottom or back surface, includes an opening of one or more through-silicon vias (TSVs) 130.

Electrical connectors 110 can be formed of a conductive material, such as metal, and configured in any suitable shape and dimension. Electrical connectors 110 can include ball-type, bump connectors, metal pads, or any other suitable types of connectors. Electrical connectors 110 (within dashed box 115) can be arranged to provide connectivity through device die 100. For example, electrical connectors 110 can enable connectivity between separate device die connected through the interconnection device die or between the device die and an external circuit, terminal or the like. In some embodiments, electrical connectors 110 can be formed of a material that includes copper and can be configured in a round shape, such as a circle. Electrical connectors 110 can have a width of between about 2 µm and about 30 µm. For example, electrical connectors 110 can have a width of about 30 µm, about 20 µm, about 10 urn, and length of about 5 µm, about 3 µm or about 2 µm. As shown in FIG. 1B, electrical connectors 110 (within dashed box 115) can be characterized as having a reduced pitch between electrical connectors 110. A pitch refers to the spacing between two or more connectors. For example, in referring to FIG. 1B, a pitch 111 between electrical connectors 110 can be between about 2 µm and about 9 µm (e.g., about 3 µm, about 4 µm, about 5 µm, about 6 µm, about 7 µm, and about 8 µm). In some embodiments, the pitch 111 between electrical connectors 110 can be between about 1 µm and 2 µm or less than 1 µm.

Device die 100 also includes redistribution circuit structure 120 (e.g., an InFO structure). Redistribution circuit structure 120 can be formed of at least two metal lines or die embedded in an encapsulant (e.g., an insulating encapsulation material), which can be a low cost material such as epoxy mold compound (EMC). The lines or die are embedded in the insulating encapsulation material with space allocated between each die for additional I/O connection points. Thus, the redistribution circuit structure can accommodate a high I/O count in a low cost epoxy material. The redistribution circuit can be formed using suitable vapor deposition and patterning processes to route I/O connections on the die to the peripheral mold compound regions. Miniaturizing or reducing the length of the connecting lines results in improved signal and power integrity (SI/PI).

FIG. 1C illustrates redistribution circuit structure 120 embedded in encapsulant 121 (e.g., an insulating encapsulation material) of device die 100, according to some embodiments. Redistribution circuit structure 120 is electrically connected to conductive terminals (e.g., electrical connectors 110) arranged on a surface of device die 100 (e.g., first surface 100A). Redistribution circuit structure 120 can include conductive lines 120A-120G that provide electrical connections to and among electrical connectors 110. Although a two-layer redistribution circuit structure is shown in FIGS. 1A and 1B, redistribution circuit structure 120 can include additional or fewer layers. Incorporation of redistribution circuit structure 120 in device die 100 permits reducing the dimensions of a die structure by a factor of at least 2.5. A high I/O count can thus be achieved without ceding valuable silicon (SI) area on adjacent interconnected device dice, such as a processor or memory die.

Referring to FIG. 1A, TSV 130 provides a channel through which an external line connects to the integrated circuit architecture of device die 100. TSV 130 is a channel that can pass completely through or partially through device die 100. TSV 130 can be formed in any shape and suitable dimensions. In an embodiment, TSV 130 can have a width between 0.4 μm and 190 μM. In some embodiments, TSV 130 permits one or more connections to redistribution circuit structure 120. In some embodiments, TSV 130 permits one or more connections from second surface 100B, which may have one or more electrical terminals disposed thereon, of device die 100 to electrical connectors 110 (on first surface 100A). That is, TSV 130 provides at least one connection path between opposite sides (e.g., the first surface 100A and second surface 100B sides) of interconnection device die 100. In some embodiments, the one or more connections include input/output (IO) connections, power or ground connections, or combinations thereof, between electrical connectors 110 and one or more electrical terminals disposed on second surface 100B. A single TSV 130 is shown in FIG. 1A; however additional TSVs can also be included.

In some embodiments, device die 100 can be configured to have small distances between device dice (e.g., channel-to-channel), which can be less than about 40 μm (e.g., less than about 30 μm, less than about 20 μm, or less than about 10 μm). Accordingly, the device-to-device or channel-to-channel distances of device die 100 can be made significantly smaller than corresponding distances in other designs, such as a printed circuit board (PCB) designs. Embodiments of the present disclosure can therefore be implemented in designs that require the integration of densely-packed integrated circuits, such as AI and big data processing applications.

Device die 100 confers benefits over other such designs. As described above, the interconnection device die configured as device die 100 can maintain a high number of I/O connections while reducing channel-to-channel spacing, thereby improving the critical connection path between system devices. For example, and as described below, the number of connections such as I/O connections within a given connection area can be improved by a factor of 2500 or more in embodiments of device die 100.

The critical connection path can be defined as the connection path linking one system element, such as a processor or a memory device die, to other such elements. The critical connection path can also represent the connection path between such elements and external circuitry connected to an I/O terminal of the interconnection device die. As described above, the critical connection path, the maximum path between any input to any output, is improved without reducing the number of available I/O connections and without sacrificing SI/PI performance. In accordance with embodiments of this disclosure, reducing the channel-to-channel spacing results in reduced transmission distances, which improve the latency, performance, and power consumption characteristics of device die 100.

Exemplary Connector Characteristics

Figure 2:
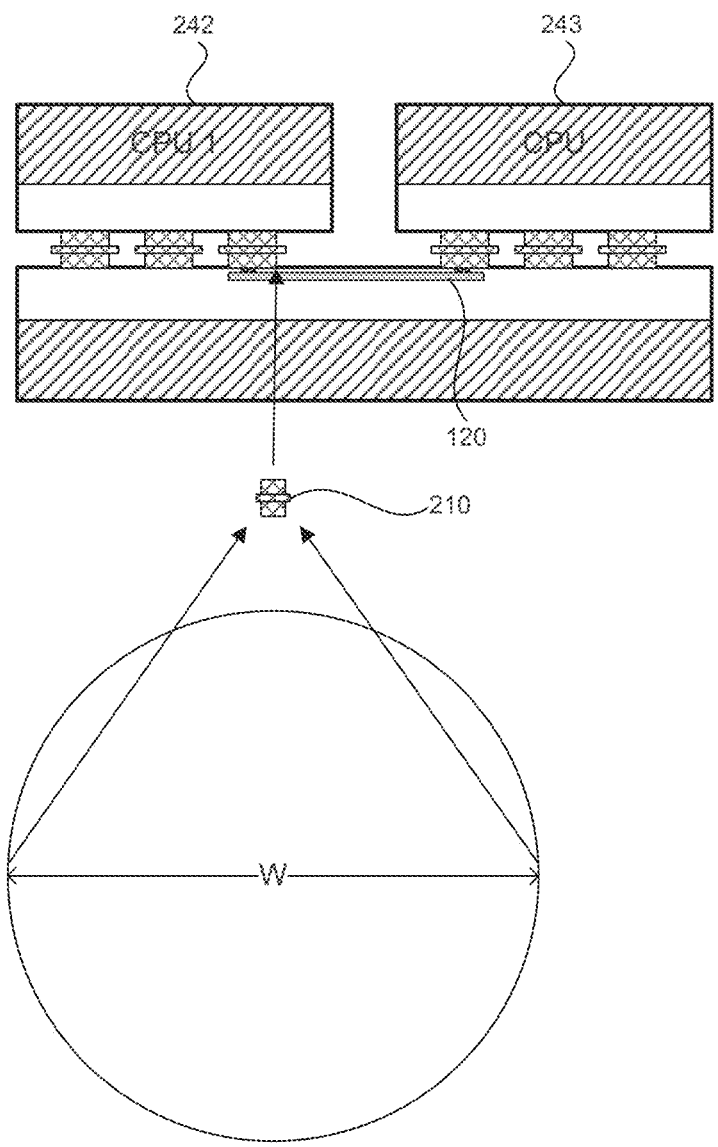
FIG. 2 is an illustration of an electrical connector or a device die, in accordance with some embodiments.

FIG. 2 illustrates an electrical connector 210, according to some embodiments. Electrical connector 210 can have a width ("W") of between about 2 μm and about 30 μm. In some embodiments, electrical connector 210 can have a width of about 30 μm, about 20 μm, about 10 μm, and length of about 5 μm, about 3 μm or about 2 μm.

In some embodiments, electrical connectors 210 can have a pitch of less than or equal to about 2 μm (e.g., about 1.5 μm, about 1 μm, and about 0.5 μm). By comparison to a die structure arranged over a PCB or other package substrate, the connector size of the present embodiments is reduced by a factor of at least about 15. By enhancing reducing the connector width and pitch, the number of connectors within a surface area can be increased. As a result, die-to-die (e.g., between die 242 and die 243) or channel-to-channel distance can be improved to be less than about 40 μm (e.g., about 30 μm, about 20 μm, about 10 μm, and about 5 μm), according to some embodiments.

Figure 3A:
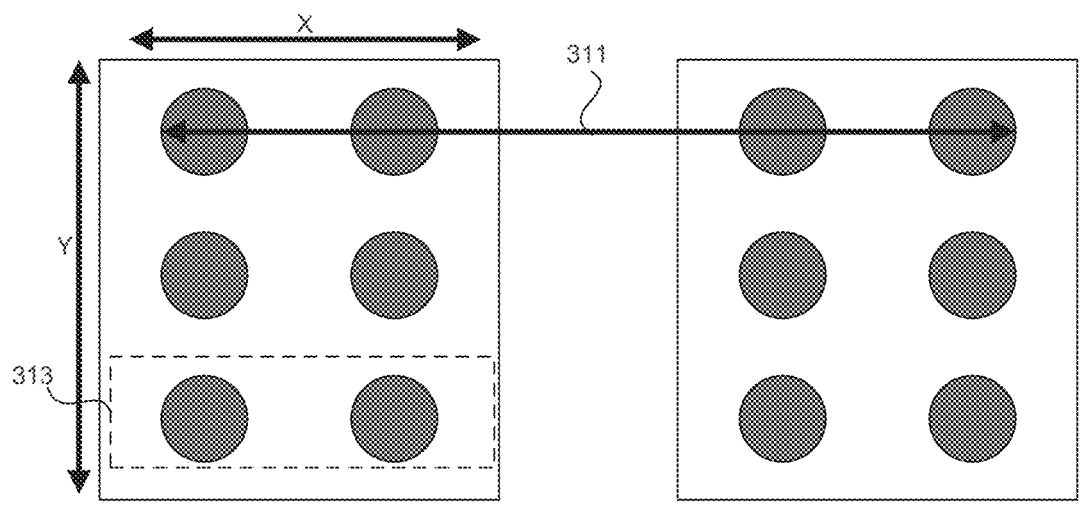
FIGS. 3A and 3B are illustrations of electrical connectors of a device die, in accordance with some embodiments.
Figure 3B:
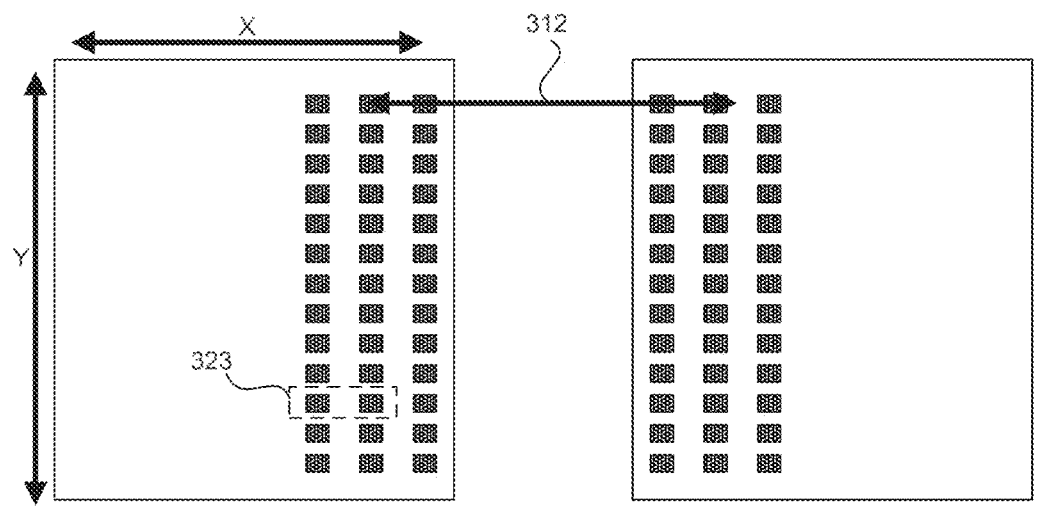

FIGS. 3A and 3B illustrate a comparison in package connection counts between ball connections in package design (FIG. 3A) and in a package according to an SOIC architecture. The ball connectors (e.g., ball connector pair 313) in FIG. 3A can be spaced apart about 100 μm from each other, for example. In FIG. 3B, a connector pitch (e.g., a pitch between the pair of connectors 323) in accordance with the present disclosure is reduced to about 2 μm or less.

By reducing the connector pitch to about 2 μm or less, the arrangement of connectors achieves a device-to-device bump grouping within a smaller area compared to other designs. Thus, connector pitch is reduced by a factor of about 50. In this example, the channel-to-channel distance 311/312 can be thereby reduced by a factor of about 50 in each direction (e.g., by a factor of fifty in the X direction and fifty in the Y direction) such that the ratio of connectors (e.g., I/O connections) in a given area is substantially improved. Thus, in this example, the number of connectors arranged in a given area (X×Y) can be improved by a factor of about 2500. Embodiments of the architecture described herein can thereby more efficiently utilize circuit area to provide increased I/O and other integrated circuit connection among device dice and connectivity to external devices.

SOIC Architecture Using an Interconnection Device Die

Figure 4A:
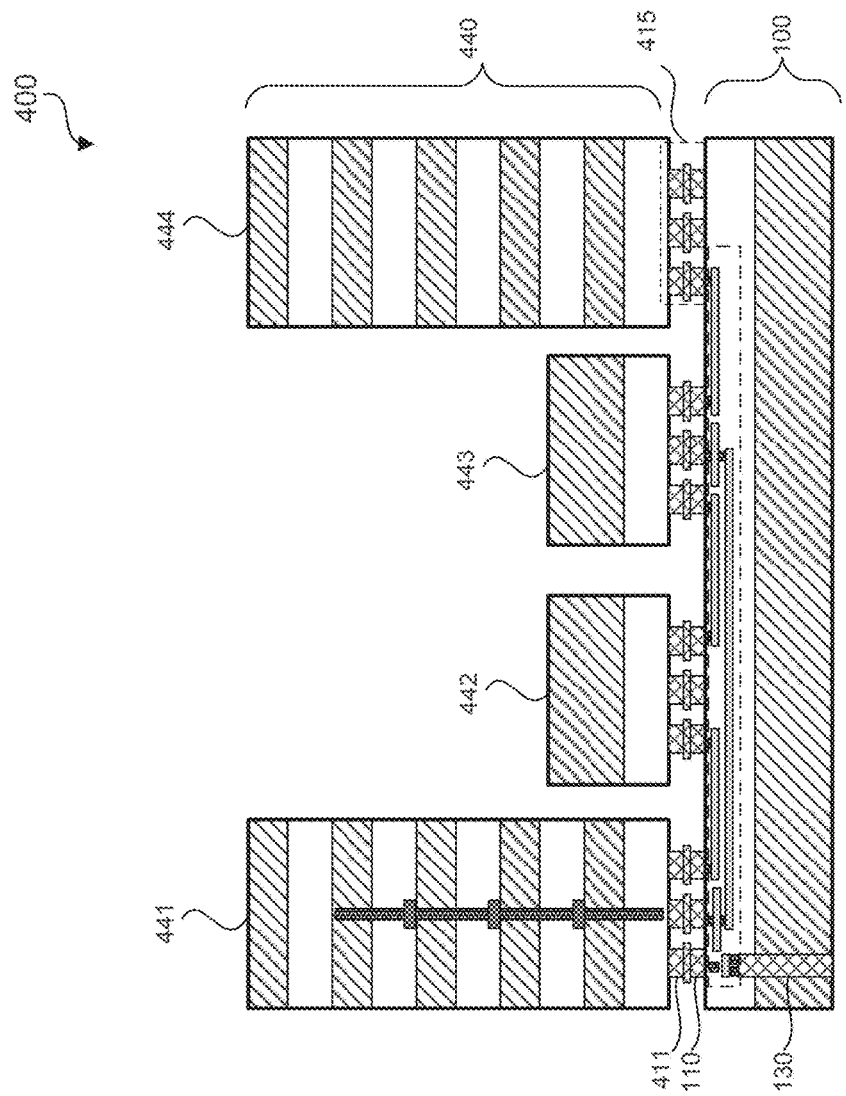
FIGS. 4A and 4B are illustrations of an exemplary SOIC AI chip architecture layout that includes a device die, according to some embodiments.
Figure 4B:
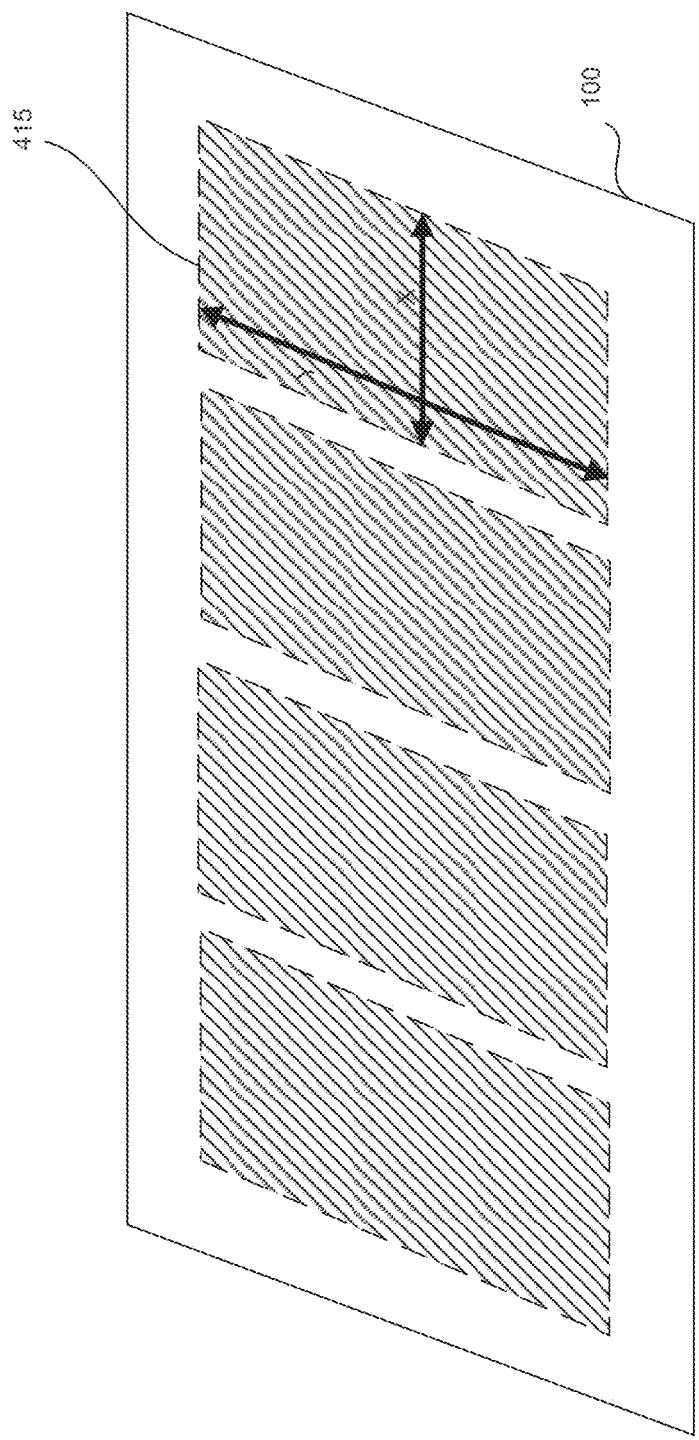

FIGS. 4A and 4B illustrate an exemplary integrated circuit package 400 using device die 100. As shown in FIG. 4A, integrated circuit package 400 includes package components 440 connected or bonded to device die 100 through connection regions 415. Package components 440 can be device dice that includes active devices (not shown) therein. In some embodiments, package components 440 include an SOIC die, a 3DIC die, a processor die, a power management die, a logic die, a communication management die (such as a baseband die), or combinations thereof.

Connection regions 415 can provide electrical connections between device die 100 and package components 440 through electrical connectors 110 and 411, respectively. Connectors arranged in connection regions 415 can include ball connectors, bump connectors, solder balls, pads, or any other type of connectors that attach device die 100 to package components 440. Connection regions 415 can include connections made through a hybrid bonding, flip chip or wire bonding process, or the like. In some embodiments, electrical connectors 110 and 411 include bumps, flip chip bumps, metal pads, metal pillars (which can include copper, tin, silver, nickel, gold, alloys thereof, composite layers thereof, or the like), metal pillars with pre-solder layers, or a combination thereof.

In this example, package components 440 of integrated circuit package 400 can include memory device dice 441 and 444. Memory device dice 441 and 444 can be SOICs, such as 3DICs. Specifically, memory device dice 441 and 444 can each be a 3DIC memory, such as dynamic random access memory (DRAM) and static random access memory (SRAM). Integrated circuit package 400 can further include processor device dice 442 and 443. In accordance with FIGS. 1A to 1C, a terminal of memory device die 441 can be connected to a terminal of processor device die 443, for example, by electrical connectors 110 and redistribution circuit structure 120 (e.g., conductors 120A to 120C). Each package component 440 can be connected to inputs/outputs (I/Os) or other connectors through TSV 130.

TSV 130 may correspond to a single TSV or to one TSV within a plurality of TSVs (not shown). TSV 130 may provide a via for connection of one or more I/O connections of each package component 440 to I/O terminals of an external device. In one example, TSV 130 may provide a channel for I/O connections of memory device die 441 to connect with another package, such as a multi-core CPU package (which may be a CPU package 500 described below in FIG. 5). In addition or alternatively, TSV 130 may provide a channel to provide a power or ground connection to each of or all package components 440.

As shown in FIG. 4B, a top surface of device die 100 can include several connection regions 415, each connection region disposed to permit connections of each memory device die 441 to 444 between and through device die 100. As described with respect to FIG. 2, by reducing the connector pitch to about 2 μm or less, a reduced device-to-device bump grouping is achieved. Here, the number of connectors arranged in the indicated area (X×Y) can be improved by a factor of about 2500 to provide increased connectivity.

By sharing and optimizing connections via interconnection device die, integrated circuit package 400 can achieve improved performance in, for example, big data, AI, and other applications requiring a large number of computations and I/O connections. Device die 100 satisfies the three Vs. The package achieves reduced connector pitch and device-to-device distances resulting in improved volume, improves the critical connection path between components and to outside circuitry, thereby improving velocity, and enabling interconnection between a variety of package components without unduly limiting to the individual system components.

Figure 5:
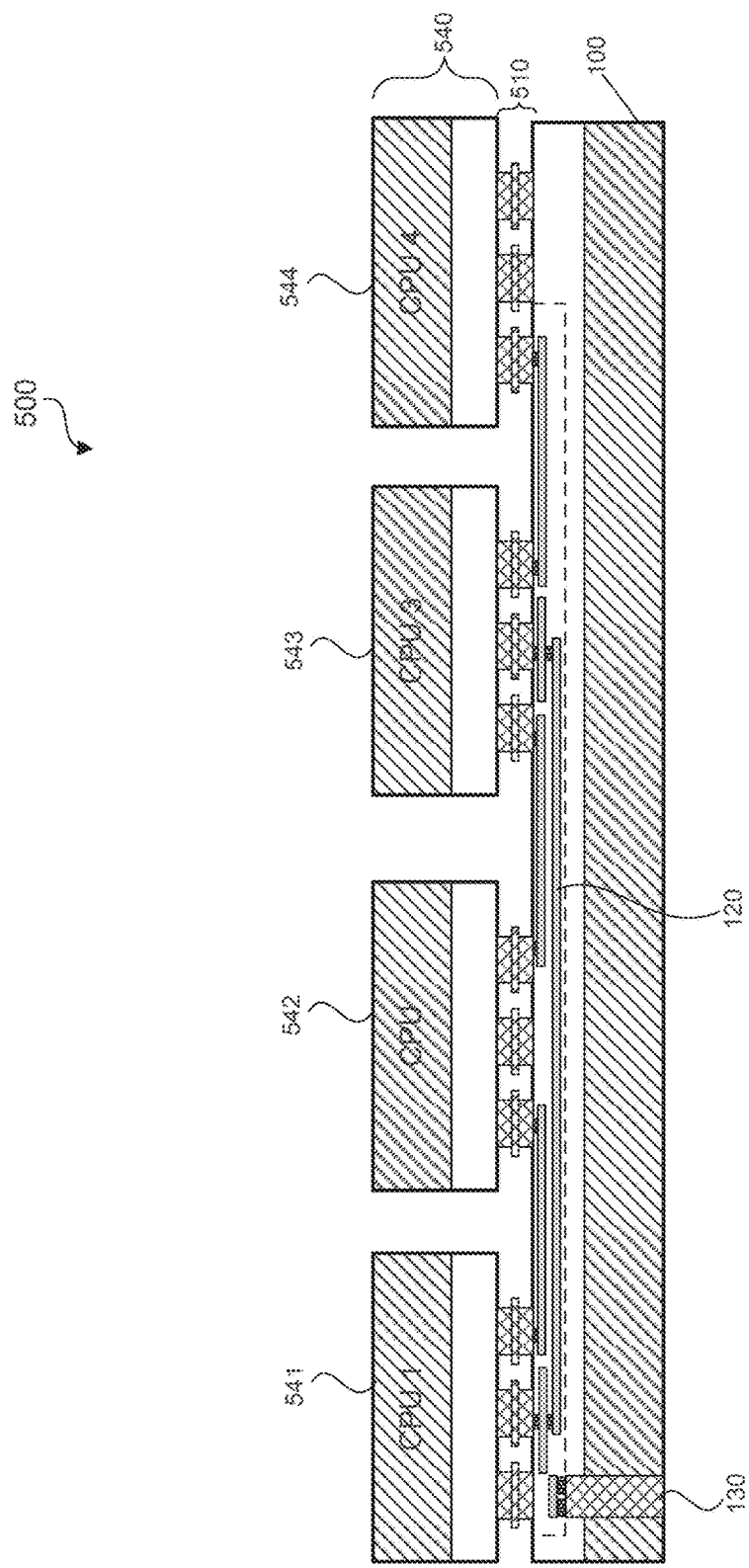
FIG. 5 is an illustration of a CPU farm connected through a device die, according to some embodiments.

SOIC Architecture Implementation of a CPU Package Using an Interconnection Device Die FIG. 5 illustrates a central processing unit (CPU) package 500, according to some embodiments. CPU package 500 includes processors 541 to 544 connected through device die 100 by electrical connectors 510. CPU package 500 can be used in a variety of big data applications, such as in a CPU farm.

In some embodiments, a CPU chip architecture include multiple processors, e.g., four, eight, or n processing cores on a device package. As noted above, big data processing power can be more efficient by reducing device bandwidth, and improving high volume interconnections, and decreasing transmission distances. Implementing multi-core architectures is a key to the achieving the processing power required for big data. Handling ever-increasing numbers and complexities of calculations, image processing, logic operations requires increased processing power. These requirements would otherwise strain the capabilities of processors. Implementing multi-core architectures on device die 100, as described herein, enables a multi-core package that achieves complex processing requirements while minimizing problems caused by excess heat generation, poor bandwidth, and the like. Accordingly, a device or system can be implemented as described herein to optimize AI and big data functions, such as processing images.

As shown in FIG. 5, according to embodiments of the present disclosure, processors 541 to 544 can share signal, power, and I/O connections, for example, through one or more TSVs 130. In addition, processors 541 to 544 can be connected to one another or to other package components through redistribution circuit structure 120. For example, processors 541 to 544 can be connected to one another, to other package components, or to external connections, through electrical connectors 510, redistribution circuit structure 120, and/or TSV 130. Therefore, device die 100 allows a package to be achieved with an optimized connection count (e.g., I/O count).

As described above, the reduced connector pitch and D2D distance achieved by packages of this disclosure enable improved transmission speed and reduced power consumption. For example, the D2D distance in some embodiments can be reduced to less than about 40 μm (e.g., less than about 30 μm, less than about 20 μm, and less than about 10 μm). The reduced pitch, D2D distances, and routing width reduces the length of a transmission signal line between interconnected devices, thereby reducing the latency. Moreover, these improvements permit a substantial increase in the number of I/O connections made within a device area.

Additionally, implementing several processing cores in a single device package can reduce the processing burden on each processor. Moreover, in reducing the number of signal and I/O count to each connected device die, embodiments of the CPU chip architecture can achieve additional improvements with respect to thermal optimization.

CPU package 500 is different from a CPU farm using static packaging, such as a CPU farm connected through a PCB or other interposing device. As described above, a critical connection path and latency between package components can be reduced while maintaining complex and configurations. Moreover, CPU package 500 can be varied to accommodate a number of package components. Although not shown, CPU package 500 can include other package components, such as SOIC dice, 3DIC dice, including memories, 3DIC memories, integrated processor/memory dice, or the like. In this regard, different hierarchies of caches can be used, on the chip as well of off the chip.

In some embodiments, CPU package 500 includes processors 541 to 544 in a face to face layout with respect to device die 100 with connection via connectors 510 that may be hybrid bonded, for example. A face to face arrangement, where a face surface of each of processors 541 to 544 are stacked on and bonded to a face surface of device die 100. Thereby, CPU package 500 can be configured to permit external I/O and power connectivity commonly through a back surface of device die 100, e.g., through TSV 130. Alternative embodiments can include package components such as processors in a F2B arrangement as described above (not shown).

Processors 541 to 544 can thereby be efficiently disposed and interconnected, minimizing connection paths between independent processors and other devices. The efficient arrangement of multiple processors in a multi-core package, e.g., CPU package 500, allows complex processing operations to be performed at reduced clock rates, reducing heat generation. Moreover, reducing D2D pitch, for example, to less than about 40 μm (e.g., less than about 30 μm, less than about 20 μm, and less than about 10 μm), reduces the corresponding transmission distance between interconnected devices, improving latency and bandwidth.

SOIC Device Structure

Figure 6:
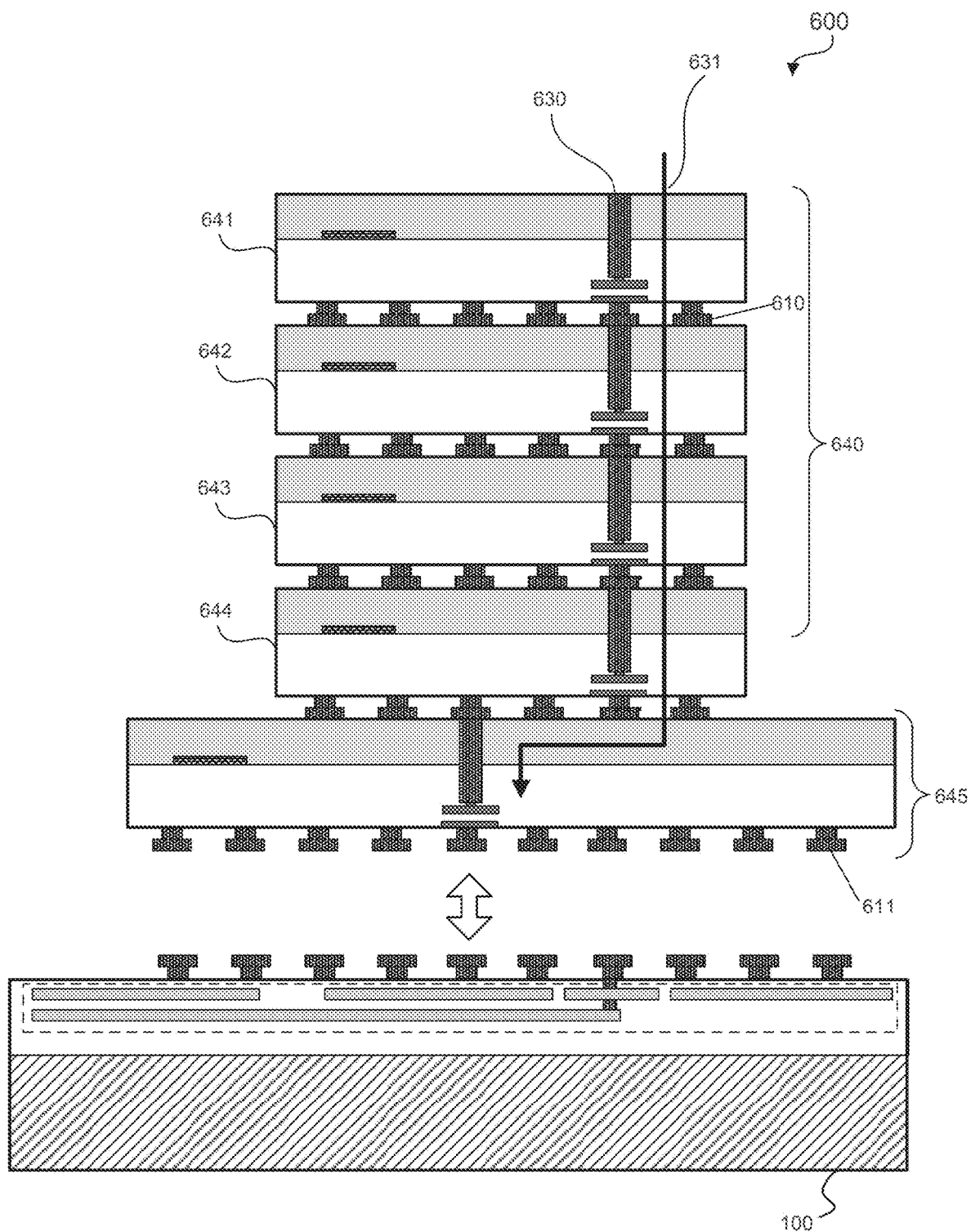
FIG. 6 is an illustration of an SOIC package optimized for an AI or big data architecture, according to some embodiments.

FIG. 6 illustrates an SOIC structure 600, according to embodiments of the present disclosure. In some embodiments, SOIC structure 600 can be formed by direct die stacking and die-to-die bonding, such as by a hybrid bonding process. For example, memory dice 641 to 644 and logic die 645 can be arranged and connected by a hybrid bonding process. TSVs 630 can provide optimized interconnectivity enabling high-density, high-bandwidth, and low-power operation.

SOIC structure 600, which can be a 3DIC SRAM includes memory dice 641 to 644 stacked on top of one another and interconnected vertically using TSVs 630. In some embodiments, TSVs 630 can extend linearly or coextensively, as shown in FIG. 6. SOIC structure 600 additionally includes a controller logic die 645, shown as the bottom die in the stack. Logic die 645 includes circuitry to serve as a controller providing processing, I/O functions, and the like. SOIC structure 600 includes electrical connectors 610 connecting an active region on the face side of a first die to metallization on the back surface of a second die. An active region of a memory die can include, for example, circuit components forming a memory array or other memory structure in each of the memory dice 641 to 644. Metallization on the back of each memory dice 641 to 644 can provide I/O and other connectivity to the circuit components. For example, an active region on the face of a first memory die 641 is connected through electrical connectors 610 to metallization on the back of a second memory die 642. Electrical connectors 611 on a surface of logic die 645 connect the 3DIC stack to other package components, for example, to the interconnection device die.

In some embodiments, SOIC structure 600 includes TSVs 630 to achieve effective and efficient connectivity between the individual dice and with respect to external package components. TSVs 630 allow a critical connection path 631, e.g., the path from the top or outermost memory die 641 to connectors 611, to pass through each die to allow addressing and signal data to reach each memory die 641 to 644 from logic die 645. Logic die 645 can also be referred to as an application processor (AP). A 3DIC stacked in this manner and controlled through critical connection path 631 achieves performance improvements by providing high-density, high-bandwidth, and low-power operation. By arranging these stacks as described, logic die 645 having a very wide data bus can be coupled to memory dice stacked and having a matching wide I/O structure.

For example, as described above with respect to FIGS. 2, 4A, and 4B, the number of connectors arranged in a given area (X×Y) can be improved by a factor of about 2500. Thus, a very wide data bus can be achieved in a given connection area, which may correspond to one or more connection regions 415, as shown in FIGS. 4A and 4B. By stacking each device die vertically, a higher density memory package can be achieved by SOIC structure 600. The low D2D pitch and vertical stacking arrangement allows individual device dies (e.g., 641 and 645) to be optimally aligned within the SOIC structure 600. As a result, optimizing routing achieves a reduction in signal latency and improved power consumption. Thereby, large memory volumes can be accessed improving memory bandwidth. In some embodiments, a bandwidth of 2.4 gigabits per second (Gbps) or higher can be achieved.

SOIC structure 600 can be connected to other package components through a common interconnection die. For example, SOIC structure can correspond to one or more package components shown in other embodiments, such as memory device dice 441 and 444 as shown in FIG. 4A. Specifically, logic die 645 of SOIC structure 600 can be a lower die of memory device dice 441 and 444, and connect to device die 100 by connectors 611. I/O and power supply paths of interconnected structures can be shared through the common interconnection die, e.g., device die 100 by TSV 130 and redistribution circuit 120 of device die 100. By providing common interconnection paths, the topology of package component connections can be improved such that a critical connection path of SOIC structure 600 can be optimized. As a result, improved connection density and smaller stack sizes can be achieved.

SOIC structure 600 can include SRAM, DRAM, or other stackable memory structure. By providing a stacked structure, memory dice and connections can be arranged in three dimensions, achieving a greater diversity of (and shorter) connection paths, as well as scalability. Accordingly, greater memory density, faster access times, reduced power consumption, and faster data transfer can be achieved. An SOIC, which can be 3DIC SOIC, such as a 3DIC SRAM or DRAM, of this disclosure can be arranged and packaged wafer-on-wafer. That is, two or more wafers can be formed and bonded, such that one of the wafers is flipped over and aligned with one or more of the other wafers. The flipped wafer and the adjacent, mirrored wafer can be bonded together. Package components of both wafers can be connected using TSVs, as shown in embodiments described herein.

The systems and devices described herein include an interconnection device die that enables high bandwidth, low latency applications in applications requiring extensive quantities of I/O and power connections. By improving SI/PI integrity and reducing the critical connection path of variously connected system components, the device die improves performance in packages, such as CPU farm or SOIC package, that execute big data and AI applications.

Embodiments of the present disclosure include a device with an interconnection device die including at least one through-silicon via (TSV), at least one redistribution circuit structure, and a plurality of electrical connectors. The device further includes a plurality of device die arranged on the interconnection device die and electrically connected to the interconnection device die by the plurality of electrical connectors. The at least one redistribution circuit structure includes one or more conductors embedded in at least one encapsulant, the one or more conductors electrically connected to conductive terminals arranged on a first surface of the interconnection device die. The at least one device die of the plurality of device die can be a three-dimensional integrated circuit (3DIC) including one or more 3DIC electrical connectors bonded to a corresponding electrical connector of the plurality of electrical connectors. The at least one device die and the interconnection device die can be arranged in a face to face configuration, where the at one least TSV electrically connects at least one device die of the plurality of device die at the first surface of the interconnection device die to a connection path to a second surface of the interconnection device die. In some embodiments, a pitch between each electrical connector of the plurality of electrical connectors can be less than or equal to about 9 μm. In some embodiments, the plurality of electrical connectors includes at least one of ball-type electrical connectors, bump electrical connectors, metal pad electrical connectors, or a combination thereof. The 3DIC includes a plurality of memory die stacked in a face to back (F2B) configuration. In some embodiments, the 3DIC further includes a controller die, where each memory die of the plurality of memory die includes at least one TSV, and each memory die can be connected to the controller die by a connection path through the at least one TSV. In some embodiments, the plurality of device die includes at least one processor arranged in a face to face configuration with the interconnection device die, where the at least one processor can be electrically connected to another plurality of device die through the interconnection device die. The 3DIC can be electrically connected to another 3DIC by the interconnection device die. In some embodiments, a pitch between each electrical connector of the plurality of electrical connectors can be between about 2 μm and about 9 μm, and where a width of each electrical connector can be between about 2 μm and about 30 μm. In some embodiments, the first surface can be opposite the second surface of the interconnection device die.

According to some embodiments, an interconnection device die includes a plurality of electrical connectors, at least one redistribution circuit structure, and at least one TSV. The plurality of electrical connectors can be arranged on a surface of the interconnection device die, where the at least one redistribution circuit structure includes one or more conductors embedded in at least one encapsulant, the one or more conductors electrically connecting conductive terminals arranged on the surface. The at least one TSV enables at least one connection from a different surface of the interconnection device die to one or more of the plurality of electrical connectors, the at least one redistribution circuit structure, or a combination thereof. In some embodiments, the plurality of electrical connectors includes at least one of ball-type electrical connectors, bump electrical connectors, metal pad electrical connectors, or a combination thereof. In some embodiments, the interconnection device die electrically connects a first device die and a second device die through the plurality of electrical connectors, the at least one redistribution circuit structure, or a combination thereof. The at least one of the first device die and the second device die can be a system on integrated chip (SOIC) die, where the plurality of electrical connectors can be arranged to connect a face of the SOIC die to a face of the interconnection device die. The plurality of electrical connectors can be arranged on a first surface of the interconnection device die, where the at least one TSV electrically connects the plurality of electrical connectors to a connection path to a second surface of the interconnection device die, and the first surface can be opposite the second surface of the interconnection device die.

According to some embodiments, a system includes an interconnection device die with a plurality of electrical connectors, at least one redistribution circuit structure, and at least one TSV. A plurality of device die can be arranged in a face to face configuration with the interconnection device die, where the plurality of device die includes at least one device die that has a memory cell, and a processor coupled to the memory cell. The at least one redistribution circuit structure can include one or more conductors embedded in at least one encapsulant, the one or more conductors electrically connected to conductive terminals arranged on a surface of the interconnection device die. In some embodiments, the processor, based on instructions stored in the memory cell, can be configured to perform a data query. The plurality of electrical connectors can be arranged on a first surface of the interconnection device die. In some embodiments, the at least one TSV electrically connects one or more connections from a second surface of the interconnection device die to one or more of the plurality of electrical connectors, the at least one redistribution circuit structure, or a combination thereof. The plurality of electrical connectors can be arranged on a first surface of the interconnection device die, where the at least one TSV electrically connects the plurality of electrical connectors to a connection path to a second surface of the interconnection device die, and the first surface can be opposite the second surface of the interconnection device die. In some embodiments, the at least one device die includes a system on integrated chip (SOIC) device. The at least one device die can include a memory device having a plurality of memory die stacked in a face to back (F2B) configuration. In some embodiments, the at least one processor and the at least one device die can be arranged in a face to face configuration with the interconnection device die, the processor can be electrically connected to the at least one device die through the interconnection device die.

Fabrication Methods for an SOIC Architecture

Figure 7:
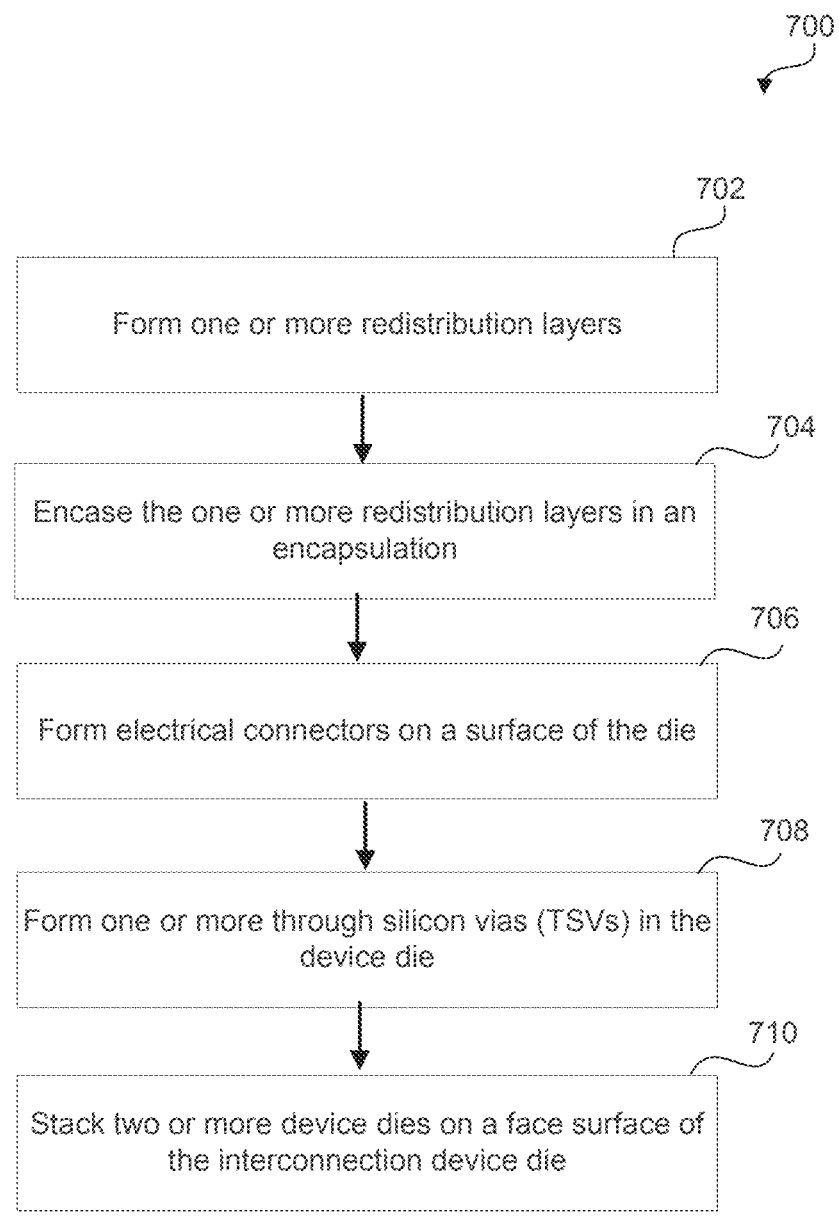
FIG. 7 is a flow chart of a method for the fabrication of an SOIC chip architecture, according to some embodiments.

According to some embodiments, FIG. 7 is an exemplary method 700 for the fabrication of an SOIC chip architecture, such as the device die and SOIC structures shown in FIGS. 1A to 1C, 4A, 4B, 5 and 6. Fabrication method 700 is exemplary and not limiting. Therefore, additional or alternative operations in method 700 may be performed in place of the operations shown in FIG. 7. Further, the order of the operations of method 700 shown in FIG. 7 is not limiting.

Method 700 begins with operation 702 and the formation of one or more redistribution layers (RDLs) of a device die (which can be an interconnection device die e.g., device die 100 of FIG. 1A). Each RDL can be formed of a conductive material to route connections on the chip's surface (e.g., conductive lines 120A to 120G of FIG. 1A). In one example, each RDL can be formed by depositing and patterning the conductive material on one or more epoxy molding compound (EMC) layers, which can be EMC wafers. Each RDL can be formed by any deposition and patterning processes. For example, a redistribution layer may be formed of a metal, metal alloy, or the like, by physical vapor deposition (PVD) metallization and electroplating processes. In some embodiments, two or more RDLs can be formed by deposition and patterning process and stacked vertically.

Method 700 proceeds with operation 704 and the deposition of a dielectric material to encapsulate the one or more RDLs. In some embodiments, the dielectric material can be an oxide-based dielectric, such as silicon oxide, deposited with plasma enhanced chemical vapor deposition or another suitable method. The dielectric material can be subsequently planarized with chemical mechanical polishing (CMP). In an alternative embodiment, the dielectric material is a molding compound, such as an epoxy-based material, that is dispensed (e.g., coated) and left to cool and harden. Once the molding compound hardens, it can be partially grinded and polished. As a result of the aforementioned process, the RDLs become encapsulated in the dielectric material. In some embodiments, the encapsulant extends across the entire surface of the interconnection device die. In additional embodiments, the encapsulant (e.g., encapsulant 121) provides structural support.

In referring to FIG. 7, method 700 continues with operation 706 where one or more electrical connectors (e.g., electrical connectors 110) may be formed, prior to stacking SOIC structures on the device die, to facilitate the mechanical and electrical coupling of the adjoining structures. In some embodiments, electrical connectors 110 can be formed by bonding pad structures and/or hybrid bonding structures and interface layers. In some embodiments, electrical connectors 110 can formed by attaching, depositing and/or patterning bump connectors, metal pads, or any other suitable types of connectors. For example, electrical connectors 110 can be formed by depositing a material that includes copper and patterning the material in a round shape, such as a circle.

Referring to FIG. 7, method 700 continues with operation 708, where one or more through-silicon-vias (TSVs) are formed in the device die (e.g., device 100). Specifically, one or more contact holes are formed in the device die 100 by, for example, a TSV process until one or more RDLs of the device die 100 are exposed. Thereafter, the one or more RDLs are electrically connected to a surface (e.g., second surface 100B) of the device die 100 through the contact holes. As shown in FIG. 1A, the redistribution layer 120 redistributes connections at a first surface 100A and a second surface 100B of the device die.

In referring to FIG. 7, method 700 continues with operation 710, where two or more device die (which may be, for example, any of SOIC structures 242 and 243 of FIGS. 2, 441 to 444 of FIGS. 4, 541 to 544 of FIG. 5, or 645 of FIG. 6) are stacked on the device die (e.g., device die 100) to form an SOIC architecture structure. For example, two or more device die can be formed by a fabrication method of an SOIC structure (described below with reference to FIG. 8). In some embodiments, the two or more device die can include at least one device die having a memory cell and a processor coupled to the memory cell.

Figure 8:
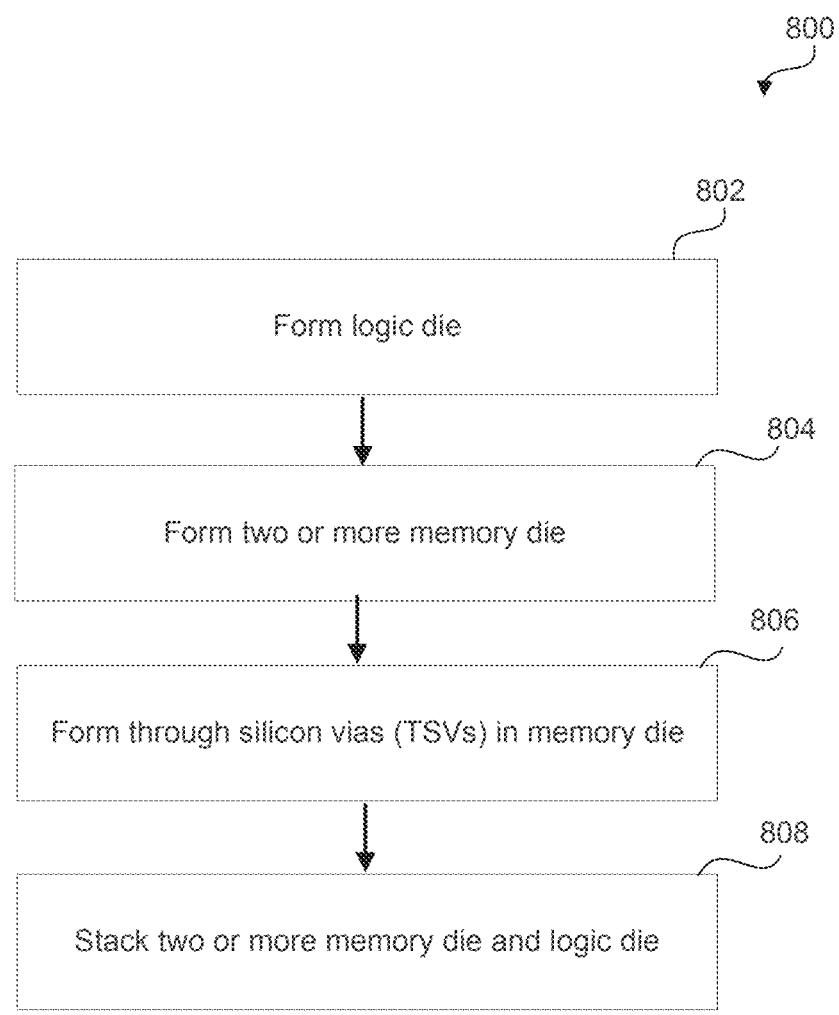
FIG. 8 is a flow chart of a method for the fabrication of a 3D three-dimensional system on integrated chip structure, according to some embodiments.

According to some embodiments, FIG. 8 is an exemplary method 800 for the fabrication of an SOIC structure, such as the structures shown in 4A, 4B and 6. Fabrication method 800 is exemplary and not limiting. Therefore, additional or alternative operations in method 800 may be performed in place of the operations shown in FIG. 8. Further, the order of the operations of method 800 shown in FIG. 8 is not limiting.

In referring to FIG. 8, method 800 can begin with operation 802, where a logic die (e.g., logic die 645, which can be an AP) is formed by fabricating a controller chip to provide processing, I/O, and other suitable functions. By way of example, operation 802 can include forming one or more microprocessors or CPUs to be included in the logic die.

In some embodiments, method 800 continues with operation 804, where two or more memory die are formed. In some embodiments, operation 804 includes forming a substrate including an active region, such as circuit components forming a memory array or other memory structure. Operation 804 can include forming the active region on a first side of a memory die. Operation 804 can include forming electrical connectors on each memory die to provide I/O and other connectivity to the circuit components. In some embodiments, electrical connectors can be formed by performing metallization on a second surface of each memory die.

In referring to FIG. 8, method 800 continues with operation 806, where one or more TSVs (e.g., TSVs 630) can be formed in memory die. In some embodiments one or more TSVs can also be formed in the logic die (e.g., logic die 645). Specifically, one or more contact holes are formed in the memory die (e.g., 641 to 644) and/or logic die (e.g., 645) by, for example, a TSV process until one or more circuit structures are exposed. The one or more circuit structures can be electrically connected to or through an adjacent device die, as shown in FIG. 6.

In referring to FIG. 8, method 800 continues with operation 808, where two or more memory die (e.g., memory die 641 to 644) and logic die (e.g., logic die 645) are stacked and bonded one on top of another. Operation 808 can include a process of planarizing and bonding contact surfaces of the memory die using suitable bonding technologies, such as hybrid bonding, fusion bonding, anodic bonding, direct bonding, room temperature bonding, pressure bonding, and/or combinations thereof. In some embodiments, the stacking operation 808 can include aligning SOIC structures via an alignment process that uses alignment marks as a guide so their respective mechanical and electrical connection points are properly aligned when the chip layers are stacked. In some embodiments, the aligning can be performed in a separate process. In some embodiments, an active region on the face of a first memory die (e.g., memory die 641) is connected through electrical connectors (e.g., electrical connectors 610) to metallization on a back surface of a second memory die (e.g., memory die 642). Subsequently, the aligned structures are bonded to the interconnection device die to form a stack. In some embodiments, the structures are bonded by a hybrid bonding process.

In some embodiments, any of the planarizing, bonding, and aligning processes can be performed in a separate process. By way of non-limiting example, in an alternate embodiment not shown, a fabrication method can include a planarizing process out of sequence from operation 808, such as immediately after operation 804.

CONCLUSION

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an interconnection device die comprising at least one through-silicon via (TSV), at least one redistribution circuit structure, and a plurality of electrical connectors; and
a plurality of device dice arranged on the interconnection device die and electrically connected to the interconnection device die by the plurality of electrical connectors,
wherein the at least one redistribution circuit structure comprises a plurality of conductors embedded in at least one encapsulant comprising an epoxy-based material, the plurality of conductors electrically connected to the plurality of electrical connectors arranged on a first surface of the interconnection device die, wherein the plurality of device dice comprise a three-dimensional integrated circuit (3DIC) bonded to the plurality of electrical connectors, wherein the plurality of device dice further comprise a first memory, a second memory, a first processor, and a second processor, wherein:
- a first terminal of the first memory is connected to a first terminal of the first processor by a first conductor of the plurality of conductors;
- a second terminal of the first memory is connected to a first terminal of the second processor by a second conductor of the plurality of conductors;
- a second terminal of the first processor is connected to a second terminal of the second processor by a third conductor of the plurality of conductors; and
- a first terminal of the second memory is connected to a third terminal of the second processor by a fourth conductor of the plurality of conductors; and wherein the at least one TSV electrically connects a third terminal of the first memory to a second surface of the interconnection device die.

2. The device of claim 1, wherein the plurality of device dice and the interconnection device die are connected by hybrid bonding, and wherein a pitch between each electrical connector of the plurality of electrical connectors is between about 2 μm and about 9 μm.

3. The device of claim 1, wherein the plurality of electrical connectors comprises at least one of ball-type electrical connectors, bump electrical connectors, metal pad electrical connectors, or a combination thereof.

4. The device of claim 1, wherein the 3DIC comprises a plurality of memory dice stacked in a face to back (F2B) configuration.

5. The device of claim 4, wherein:
the 3DIC further comprises a controller die,
each of the plurality of memory dice comprises at least one TSV, and
each of the plurality of memory dice is electrically connected to the controller die by a connection path through the at least one TSV of the plurality of device dice.

6. The device of claim 4, wherein the plurality of device dice comprise at least one processor comprising another plurality of electrical connectors on a fourth surface of the at least one processor, wherein the fourth surface of the at least one processor and the first surface of the interconnection device die face each other, wherein the at least one processor is electrically connected to another plurality of device dice through the interconnection device die.

7. The device of claim 1, wherein the 3DIC is electrically connected to another 3DIC by the interconnection device die.

8. The device of claim 1, wherein the first surface is opposite to the second surface of the interconnection device die.

9. The device of claim 1, wherein a width of the at least one TSV is between about 0.4 μm and about 190 μm.

10. The device of claim 1, wherein a distance between the plurality of device dice is less than about 40 μm.

11. The device of claim 1, wherein:
the first, third, and fourth conductors are in a first layer of the at least one redistribution circuit structure; and
the second conductor is in a second layer of the at least one redistribution circuit structure.

12. A device, comprising:
a device die comprising connectors arranged in connection regions on a surface of the device die, a through-silicon via (TSV) coupled to at least one of the connectors, and a redistribution circuit structure therein, wherein a surface of the TSV is coplanar with another surface of the device die; and
integrated circuit package components arranged side-by-side on the device die and coupled directly to the device die by the connectors, the integrated circuit package components comprising:
a first processor die comprising first and second terminals;
a first vertical stack of memory dies comprising third, fourth, and fifth terminals, wherein the fourth terminal is coupled to the first terminal via the redistribution circuit structure, and wherein the third terminal is in contact with the TSV;
a second processor die comprising sixth, seventh, and eighth terminals, wherein the sixth terminal is coupled to the second terminal via the redistribution circuit structure, and wherein the seventh terminal is coupled to the fifth terminal via the redistribution circuit structure; and
a second vertical stack of memory dies comprising a ninth terminal coupled to the eighth terminal via the redistribution circuit structure.

13. The device of claim 12, further comprising another through-silicon via (TSV) coupling the memory dies in the vertical stack of memory dies to one another.

14. The device of claim 12, wherein the connectors comprise one or more of ball connectors, bump connectors, flip-chip bumps, solder balls, metal pads, and metal pillars.

15. The device of claim 12, wherein the memory dies comprise one or more of a system on integrated chip, a three-dimensional integrated circuit, a static random access memory, and a dynamic random access memory.

16. The device of claim 12, wherein the memory dies in the vertical stack of memory dies have a face-to-back arrangement.

17. The device of claim 12, wherein:
the connectors comprise hybrid bonded connectors; and
the memory dies are arranged in a face-to-back configuration.

18. A device, comprising:
an interconnection device die comprising a plurality of connectors arranged in connection regions on a surface of the interconnection device die and a redistribution circuit structure, wherein the redistribution circuit structure comprises a plurality of conductors;
a through-silicon via (TSV);
a first processor comprising first and second terminals in contact with first and second connectors of the plurality of connectors, respectively;
a second processor comprising third, fourth, and fifth terminals in contact with third, fourth, and fifth connectors of the plurality of connectors, respectively, wherein a first conductor of the plurality of conductors is in contact with the first and third connectors;
a first stack of memory dies comprising six, seventh, and eighth terminals in contact with six, seventh, and eighth connectors of the plurality of connectors, wherein a second conductor of the plurality of conductors is in contact with the second and sixth connectors, wherein a third conductor of the plurality of conductors is in contact with the fourth and seventh connectors, and wherein the eighth connector is in contact with the TSV; and
a second stack of memory dies comprising a ninth terminal in contact with a ninth connector of the plurality of connectors, wherein a distance between the stack of memory dies and the processor is less than about 40 µm, and wherein a fourth conductor of the plurality of conductors is in contact with the fifth and ninth connectors.

19. The device of claim 18, wherein memory dies in the stack of memory dies are coupled to one another via the TSV.

20. The device of claim 18, further comprising an additional stack of memory dies, wherein the stack of memory dies and the additional stack of memory dies are coupled to one another via the connectors and the interconnection device die.

21. The device of claim 18, wherein the connectors comprise hybrid bonding connectors, and wherein the surface of the interconnection device die comprises a plurality of connection regions with a connector pitch between about 1 µm and about 2 µm.

* * * * *